United States Patent
Turner et al.

(10) Patent No.: US 11,348,594 B2
(45) Date of Patent: May 31, 2022

(54) STREAM CONFORMANT BIT ERROR RESILIENCE

(71) Applicant: QUALCOMM Incorporated, San Diego, CA (US)

(72) Inventors: Richard Turner, Belfast (GB); Megan Lucy Taggart, Ballyhalbert (GB); Laurent Wojcieszak, Belfast (GB); Justin Hundt, Londonderry (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/899,532

(22) Filed: Jun. 11, 2020

(65) Prior Publication Data
US 2021/0390966 A1    Dec. 16, 2021

(51) Int. Cl.
*G10L 19/032* (2013.01)
*G10L 19/005* (2013.01)

(52) U.S. Cl.
CPC .......... *G10L 19/032* (2013.01); *G10L 19/005* (2013.01)

(58) Field of Classification Search
CPC ............................ G10L 19/032; G10L 19/005
See application file for complete search history.

(56) References Cited

U.S. PATENT DOCUMENTS

| | | | | |
|---|---|---|---|---|
| 5,822,458 A * | 10/1998 | Silverstein | ............. | H04N 19/85 |
| | | | | 382/235 |
| 2008/0247002 A1 | 10/2008 | Au et al. | | |
| 2011/0075724 A1* | 3/2011 | Reznik | .................... | G06T 9/008 |
| | | | | 375/240.01 |
| 2011/0103445 A1* | 5/2011 | Jax | ......................... | H04N 19/30 |
| | | | | 375/224 |

(Continued)

FOREIGN PATENT DOCUMENTS

EP    1104969 A1    6/2001

OTHER PUBLICATIONS

Hajduk V., et al., "Cover Selection Steganography with Intra-Image Scanning," 2018, 28th International Conference Radioelektronika (Radioelektronika), IEEE, Apr. 19, 2018 (Apr. 19, 2018), 4 pages, XP033355966, DOI: 10.1109/RADIOELEK.2018.8376370 [retrieved on Jun. 8, 2018], section I, Introduction, third paragraph, lines 2-11.

(Continued)

*Primary Examiner* — Bryan S Blankenagel
(74) *Attorney, Agent, or Firm* — Qualcomm Incorporated

(57) ABSTRACT

Methods, devices, non-transitory computer-readable medium, and systems are described for compressing audio data. The techniques involve obtaining a sequence of digitized samples of an audio signal, performing a transform using the sequence of digitized samples, to generate a plurality of spectral lines, obtaining a group of spectral lines from the plurality of spectral lines, and quantizing the group of spectral lines to generate a group of quantized values.

(Continued)

Quantizing the group of spectral lines to generate the group of quantized values may comprise performing a specialized rounding operation on a spectral line selected from the group of spectral lines and using the specialized rounding operation to force a group parity value, computed for the group of quantized values, to a predetermined parity value. One or more data frames based on the group of quantized values may be outputted.

56 Claims, 11 Drawing Sheets

(56) References Cited

U.S. PATENT DOCUMENTS

| | | | |
|---|---|---|---|
| 2014/0016786 A1* | 1/2014 | Sen | G10L 19/008 |
| | | | 381/23 |
| 2016/0027448 A1* | 1/2016 | Dietz | G10L 19/035 |
| | | | 704/500 |
| 2017/0221492 A1* | 8/2017 | Villemoes | G10L 19/0208 |
| 2019/0058889 A1* | 2/2019 | He | H04N 19/46 |

OTHER PUBLICATIONS

International Search Report and Written Opinion—PCT/US2021/025528—ISA/EPO—dated Jul. 19, 2021.

* cited by examiner

400

| spectral lines / Gain | Float | Integer | quantization error | Rounding residual |
|---|---|---|---|---|
| 105/10 | 10.5 | 11 | .5 | -1 |
| 201/10 | 20.1 | 20 | .1 | +1 |
| 174/10 | 17.4 | 17 | .4 | +1 |
| 139/10 | 13.9 | 14 | .1 | -1 |

| Integer | Quantization Error | Rounding Residual | Est. Range (Normal) | Parity Residual | Est. Range (New) |
|---------|-------------------|-------------------|---------------------|-----------------|------------------|
| 17 | .4 | +1 | [17, 17.5] | 0 | |
| 18 | .6 | -1 | [17.5, 18] | 1 | [17, 17.5] |

800

| Code word | Quantised value |
|---|---|
| 0x42 | 8 |
| 0x67 | 4 |
| 0xC3 | 11 |
| 0xD3 | 14 |

| Spectral value | Gain | Value | Quantised value | New quantised value to enforce parity | code word | binary |
|---|---|---|---|---|---|---|
| 105 | 10 | 10.5 | 10 | 11 | 0xC3 | 11000011 |
| 117 | 10 | 11.7 | 11 | 11 | 0xC3 | 11000011 |
| 80 | 10 | 8 | 8 | 8 | 0x42 | 01000010 |
| 42 | 10 | 4.2 | 4 | 4 | 0x67 | 01100111 |
| | | total | 33 | 34 | | |
| | | parity | Odd | Even | | |

FIG. 8B

STREAM CONFORMANT BIT ERROR RESILIENCE

BACKGROUND

Aspects of the disclosure relate to compression and decompression of audio data. Modern encoders and decoders for audio signals generally adopt efficient transform-based techniques for lossy compression/decompression of audio data. For example, certain codec encoders and decoders are based on transforms such as the modified discrete cosine transform (MDCT). The encoded output is generally provided to a channel, such as a transmission channel or storage channel. On the other side of the channel, the encoded output is decoded to generate a reproduction of the original audio signal. The channel is typically associated with noise and can introduce bit errors, which can degrade the quality of the reproduced audio signal. One approach to combating such bit errors is to re-transmit the encoded output. However, re-transmissions are associated with delay, which is undesirable especially for applications such as live audio transmission in the context of a video conference, multimedia stream, audio call, etc. Furthermore, standards already exist for compression and decompression of audio data. Many devices incorporating existing standards are already deployed in the field. New devices that adopt a completely new compression/decompression scheme can fail to interoperate with such existing devices, which diminishes the usefulness of the new compression/decompression scheme. Thus, there exists a significant need for improved techniques for the reduction of bit errors and latency in the compression and decompression of audio data, preferably in a manner compatible with devices implementing already existing audio data compression/decompression standards.

BRIEF SUMMARY

Certain embodiments are described relating to techniques for compressing audio data, and specifically to stream conformant bit error resilience. A stream conformant technique may alter a stream of encoded audio data without changing the nature or structure of the stream, thus allowing any decoder implementation based on the specification governing the stream to decode it. Bit error resilience refers to the ability to be resilient to bit errors, such as the ability to detect errors, correct errors, etc. According to various embodiments, data compression techniques may comprise obtaining a sequence of digitized samples of an audio signal, performing a transform using the sequence of digitized samples, to generate a plurality of spectral lines, obtaining a group of spectral lines from the plurality of spectral lines, and quantizing the group of spectral lines to generate a group of quantized values. Quantizing the group of spectral lines to generate the group of quantized values may comprise performing a specialized rounding operation on a spectral line selected from the group of spectral lines and using the specialized rounding operation to force a group parity value, computed for the group of quantized values, to a predetermined parity value. The data compression technique may further comprise outputting one or more data frames based on the group of quantized values.

The specialized rounding operation may be performed on a pre-rounding value associated with the selected spectral line. The pre-rounding value may comprise a floating-point value or a fixed-point value. The group of quantized values may comprise a group of integers or fixed-point values. The specialized rounding operation may flip a rounding direction used for rounding the pre-rounding value associated with the selected spectral line, to force the group parity value computed for the group of quantized values to the predetermined parity value.

The selected spectral line may be selected for being associated with a pre-rounding value having a minimal distance to a midpoint between two nearest possible quantized values, as compared to other spectral lines in the group of spectral lines. The selected spectral line may be selected based on a selection bias favoring higher frequency spectral lines. For example, in a tie between a first spectral line associated with a first pre-rounding value having a first distance to a midpoint between two nearest possible quantized values and a second spectral line associated with a second pre-rounding value having a second distance to a midpoint between two nearest possible quantized values, the first distance being equal to the second distance, the first spectral line may be selected for being associated with a higher frequency bin of the transform than the second spectral line.

In one embodiment, the group of spectral lines may include a first spectral line associated with a first frequency bin and a first pre-rounding value and a second spectral line associated with a second frequency bin and a second pre-rounding value. The first frequency bin may correspond to a higher frequency bin of the transform than the second frequency bin. The first pre-rounding value may correspond to a first distance between two nearest possible quantized values, and the second pre-rounding value may correspond to a second distance between two nearest possible quantized values, the second distance being less than the first distance. In the first spectral line may nevertheless be selected over the second spectral line.

The one or more data frames may comprise a group of codewords based on the group of quantized values. The group of codewords may be generated from the group of quantized values using arithmetic encoding. The one or more data frames may further comprise, for at least one quantized value in the group of quantized values, a rounding residual value. The one or more data frames may further comprise, for the at least one quantized value in the group of quantized values, a parity residual value. The rounding residual value and the parity residual value may be inserted in place of padding bits in the one or more data frames.

The specialized rounding operation may be used to force a sequence of groups of quantized values, quantized from a sequence of groups of spectral lines from the plurality of spectral lines, to have a sequence of predetermined parity values. The sequence of predetermined parity values may be used as a watermark. The watermark may signify use of the specialized rounding operation. The watermark may also signify presence of one or more parity residual values in the one or more data frames. In addition, the watermark may be associated with a specific provider of a device implementing the method for compressing audio data.

The one or more data frames may maintain compatibility with an existing standard for audio data compression.

Certain embodiments are also described relating to techniques for de-compressing audio data. The data de-compressing techniques may comprise obtaining one or more data frames, obtaining a group of quantized values based on the one or more data frames, wherein the group of quantized values originates from a compression-side quantization process involving a specialized rounding operation performed on a spectral line to force a parity value, computed for the group of quantized values, to a predetermined parity value, computing a receive-side parity value for the group of quantized values, comparing the computed receive-side parity value to the predetermined parity value for the group of quantized values, performing a bit error operation to detect or correct at least one bit error in the one or more data frames, in response to detecting a difference between the computed receive-side parity value and the predetermined parity value for the group of quantized values, estimating a group of spectral lines based on the group of quantized values, taking into account detection or correction of the at least one bit error in the one or more data frames, performing an inverse transform using a plurality of spectral lines, including the group of spectral lines, to generate a sequence of digitized samples, and outputting the sequence of digitized samples as a digital representation of an audio signal. The one or more data frames may comprise a group of codewords, and the bit error operation may be performed to detect or correct at least one bit error in the group of codewords, by utilizing multiple transmissions of the group of codewords. The at least one bit error in the group of codewords may be corrected by obtaining the multiple transmissions of the group of codewords, generating a plurality of reconstructed versions the group of codewords, and selecting one reconstructed version of the group of codewords from the plurality of reconstructed versions of the group of codewords, based on a match between (1) the computed receive-side parity value associated with the one reconstructed version of the group of codewords and (2) the predetermined parity value.

A weak bit mask indicating positions of possible bit errors may be generated by comparing the multiple transmissions of the group of codewords. Each of the plurality of reconstructed versions of the group of codewords may be reconstructed by changing a bit at one of the bit positions indicated by the weak bit mask. The multiple transmissions of the group of codewords may comprise (1) an original transmission of the group of codewords and (2) one or more re-transmissions of the group of codewords. The one or more data frames may include one or more cyclic redundancy check (CRC) values for the group of codewords. Each of the one or more re-transmissions of the group of codewords may be triggered by a failed CRC associated with a previous transmission of the group of codewords. The group of quantized values may be generated from the group of codewords using arithmetic decoding. The one or more data frames may further comprise, for at least one quantized value in the group of quantized values, a rounding residual value. The one or more data frames may further comprise, for the at least one quantized value in the group of quantized values, a parity residual value. The rounding residual value and the parity residual value may be extracted from positions of padding bits in the one or more data frames. A spectral line from the group of spectral lines may be estimated with increased resolution by taking into account the rounding residual value and the parity residual value. The rounding residual value may indicate a first estimated range of values for the spectral line, and the parity residual value may indicate a second estimated range of values for the spectral line adjacent to the first estimated range. The spectral line may be estimated based on the second estimated range of values.

BRIEF DESCRIPTION OF THE DRAWINGS

Aspects of the disclosure are illustrated by way of example.

FIG. 4 presents a table showing examples of quantization errors resulting from spectral line quantization performed using a standard rounding rule;

FIG. 8A shows an example code book mapping the possible quantized values of spectral lines to corresponding codewords;

FIG. 8B presents a table showing details of how the transmit side of the channel may quantize four spectral lines, which correspond to four different frequency bins;

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

Overall System

Figure 1:
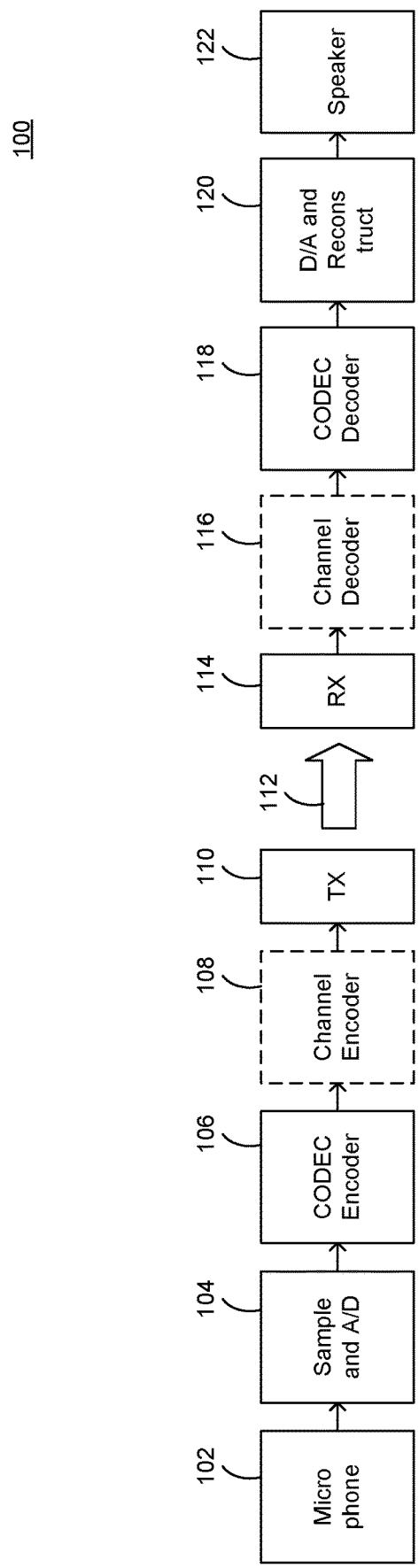
FIG. 1 presents a simplified diagram of a system that may incorporate one or more embodiments of the disclosure.

FIG. 1 presents a simplified diagram of a system 100 that may incorporate one or more embodiments of the disclosure. System 100 illustrates a one-way path of audio signal propagation comprising a transmit side and a receive side. While only a one-way path is illustrated, in many applications another path in the opposite direction is simultaneously implemented, resulting in a bi-directional arrangement. As shown, system 100 comprises, on the transmit side, a microphone 102, a sample and analog-to-digital (A/D) conversion unit 104, a codec encoder 106, an optional channel encoder 108, and transmitter 110. The output of transmitter is sent to a channel 112, which may represent a transmission channel or storage channel. System 100 further comprises, on the receive side, a receiver 114, an optional channel decoder 116, a codec decoder 118, a digital-to-analog (D/A) conversion and signal reconstruction unit 120, and a speaker 122.

On the transmit side, microphone 102 captures sound from an environment and converts the sound waves into an analog electrical signal. The analog electrical signal is sent to the sample and A/D conversion unit 104, which samples the analog electrical signal according to a sampling frequency and quantizes each sample, by utilizing a sample and quantization scheme such as pulse code modulation (PCM). This results in digitized samples representing the original audio signal. The sample and A/D conversion unit 104 may apply filtering and other signal conditioning techniques to the signal before and/or after A/C conversion. The sample and A/D conversion unit 104 sends the digitized samples to the codec encoder 106. The codec encoder 106 performs lossy compression on the digitized samples, to generate compressed digital data. The compressed digital data is sent to the optional channel encoder 108, which may perform channel coding using the compressed digital data, to generate channel bits or symbols. Different types of channel coding techniques may be implemented, including forward error correction (FEC) coding. The optional channel encoder 108 sends the channel bits/symbols to the transmitter 110. Alternatively, no channel encoder is used. In that case, the compressed digital data may be sent directly to the transmitter 110 without performing any channel encoding, and the compressed digital data may be used as channel bits/symbols. The transmitter 110 processes the channel bits/symbols in a manner appropriate for the channel 112. For example, the transmitter 110 may modulate the channel bits/symbols onto a carrier signal prior to sending the modulated carrier signal over the channel.

Channel 112 may represent a transmission channel, storage channel, or other channel. A transmission channel may be a wired or wireless channel, such as an over-the-air channel. The transmitter 110 may use a transmit antenna to send the modulated carrier signal over the air. A storage channel may comprise a storage medium on which the channel bits/symbols may be "written" and later retrieved. For instance, the transmitter 110 may utilize a writing device to write the channel bits/symbols to the storage medium, where the channel bits/symbols may be retained. Channel 112 may subject the channel bits/symbols to noise, interference, and other degradations, introducing errors.

On the receive side, the receiver 114 receives the channel bits/symbols from the channel 112. The receiver 114 demodulates or otherwise processes the signal received from the channel 112, to generate received channel bits/symbols. For example, the receiver 114 may utilize an antenna to receive a modulated carrier signal and perform demodulation to produce the received channel bits/symbols. In another example, the receiver 114 may utilize a reading device for reading the channel bits/symbols from the channel 112 as a storage channel. The received channel bits/symbols are sent to the optional channel decoder 116, which may perform channel decoding, e.g., FEC decoding, to convert the received channel bits/symbols to compressed digital data. The compressed digital data is sent to the codec decoder 118. Alternatively, no channel decoder is used. In that case, the channel bits/symbols are sent directly to the codec decoder 118 without performing any channel decoding, and the channel bits/symbols may be used as the compressed digital data. The codec decoder 118 performs de-compression on the compressed digital data, to generate digitized samples of the audio data. The digitized samples are sent to the D/A and reconstruction unit 120, which performs digital-to-analog conversion and reconstruction, such as filtering and/or interpretation, to generate an analog electrical signal. The analog electrical signal is sent to the speaker 122, which may produce and project sound waves into an environment, based on the analog electrical signal.

DCT/MDCT Transform

Figure 2:
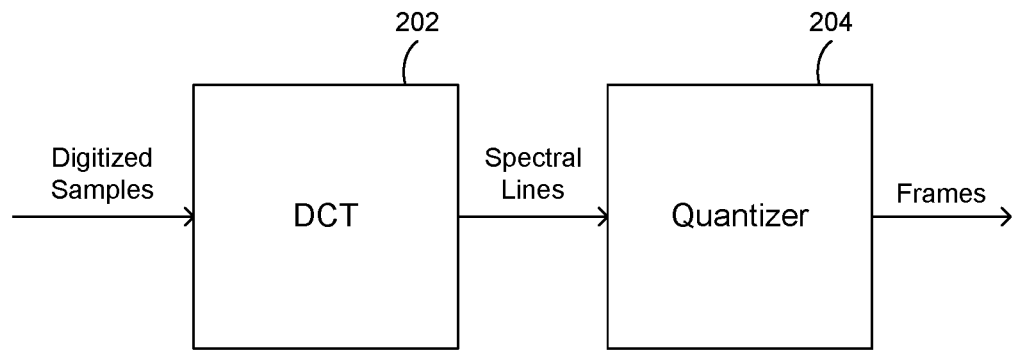
FIG. 2 presents a block diagram of a codec encoder, according to various embodiments of the present disclosure.

FIG. 2 presents a block diagram of the codec encoder 106, according to various embodiments of the present disclosure. As shown, the codec encoder 106 comprises a discrete cosine transform (DCT) encoder 202 and a quantizer unit 204. Digitized samples are obtained, e.g., from the sample and A/D conversion unit 104 shown in FIG. 1, and sent to the DCT encoder 202. While a DCT encoder is shown, transform encoders based on different types of transforms may be used in other embodiments. The DCT encoder 202 performs DCT transform on the digitized samples, to transform the digitized audio data from the time domain to the frequency domain. The output of the DCT transform comprises transform coefficients, generally referred to herein as "spectral lines." Each spectral line comprises a numerical value reflecting the magnitude of the digitized audio data within a corresponding frequency bin. The number of frequency bins may vary depending on implementation. In some embodiments, the DCT encoder 202 generates up to 400 spectral lines (i.e., for 400 different frequency bins) in each transform operation.

In practice, the DCT encoder 202 performs such transform operations on time-limited blocks of the digitized samples. In some embodiments, successive blocks of digitized samples may overlap in time. The DCT encoder 202 may perform the transform operation on each block of digitized samples to generate, e.g., up to 400 (or more) spectral lines for each block of digitized samples. The DCT encoder 202 may perform such an operation for a first block of digitized samples, then a second block of digitized samples, then a third block of digitized samples, and so on, to generate a first set of spectral lines, a second set of spectral lines, a third set of spectral lines, and so on.

Just as an example, a modified discrete cosine transform (MDCT) implementation is described below. Here, for a block t, 2N time domain samples $x_t(k)$, $k=0, \ldots, 2N-1$ are used to calculate N spectral lines $X_t(m)$; $m=0, \ldots, N-1$. In this example, two succeeding blocks overlap by 50%, so each block processes N new time domain samples. A windowing function $w(k)$, $k=0, \ldots, 2N-1$ may be used to smooth the overlapping blocks of digitized samples. The MDCT in this example may be expressed as:

$$X_t(m) = \sqrt{\frac{2}{N}} \sum_{k=0}^{2N-1} w(k)x_t(k)\cos\left(\frac{\pi}{4N}(2k+1+N)(2m+1)\right) \quad \text{(Eq. 1)}$$

$$m = 0, \ldots, N-1$$

In the present disclosure, the term "spectral lines" generally refers to transform outputs based on audio signals and is not limited to the particular definition provided as an example in Eq. 1 above. Other definitions of spectral lines may be adopted for a DCT transform or MDCT transform. Furthermore, other definitions of spectral lines may be adopted for non-DCT type transforms.

Quantization and Data Frame Assembly

The quantizer unit 204 obtains each set of spectral lines from the DCT encoder 202 and generates data frames comprising compressed audio data. The quantizer unit 204 performs quantization on each set of spectral lines, in order to compress the audio data. The greater the degree of quantization, the more compression that is achieved. The term "data frames" is used herein generally to refer to an organization or arrangement of the compressed audio data. The data frame can but does not necessarily relate to how the compressed audio data may be packetized or otherwise arranged for downstream transport. While particular examples of data frames are described in accordance with specific embodiments of the disclosure, the organization of compressed data within a data frame needs not be restricted to the format shown in the embodiments presented. Illustrative operation of the quantizer unit 204 is described in more detail below.

Figure 3:
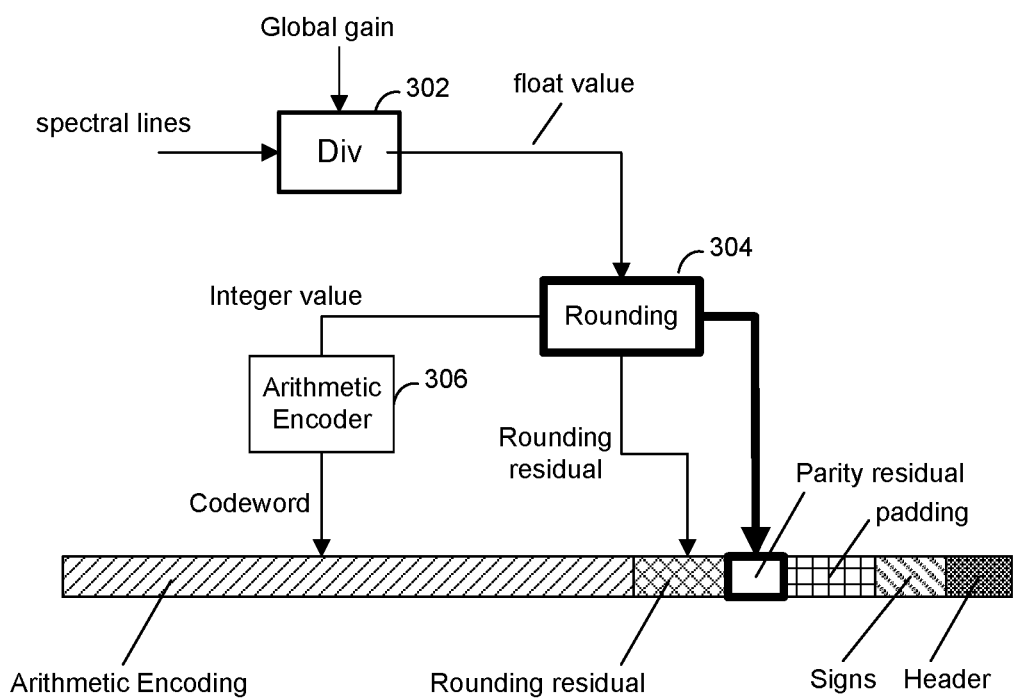
FIG. 3 illustrates an example of certain internal components of a quantizer unit, according to an embodiment of the present disclosure.

FIG. 3 illustrates an example of certain internal components of the quantizer unit 204, according to an embodiment of the present disclosure. Quantization is performed by rounding values representing spectral lines, in order to generate quantized values. A value prior to rounding may be referred to as a "pre-rounding" value. In some embodiments, each pre-rounding value may be a floating-point value. In other embodiments, each pre-rounding value may be a fixed-point value. A value after rounding may be referred to as a "quantized" value. In some embodiments, each quantized value may be an integer. In other embodiments, each quantized value may be a fixed-point value. In the illustrative examples below, each pre-rounding value is shown as a floating-point value, and each quantized value is shown as an integer. However, the techniques disclosed herein for leveraging rounding to enforce parity requirements may be used for pre-rounding values expressed as fixed-point values and/or quantized values expressed as fixed-point values. Returning to FIG. 3, the quantizer unit 204 may comprise a division unit 302, a rounding unit 304, and an arithmetic encoder 306. Here, the quantizer unit 204 performs quantization by scaling each spectral line using a global gain and then rounding the resulting gain-adjusted value, which may be expressed as a floating-point value, to generate a quantized value. Here, each quantized value is an integer. For example, a spectral line may be sent to the division unit 302. A global gain value, e.g., 10, may also be sent to the division unit 302. The division unit 302 performs a division operation. In this example, the spectral line value is divided by 10. The division unit 302 may output a floating-point value representing the gain-adjusted spectral line value. The floating-point value is sent to the rounding unit 304, which performs a rounding operation on the floating-point value to generate an integer value. The rounding operation may be performed using a standard rounding rule—e.g., rounding a floating-point value x to the nearest integer value y. If the floating-point value x falls exactly halfway between two integer values, y and y+1, a tie-breaking convention may be used such as always rounding up in case of a tie, i.e., y=x+0.5 (or always rounding down in case of a tie, i.e., y=x−0.5). The rounding unit 304 generates an integer value resulting from performing the rounding operation on the floating-point value. The rounding unit 304 may also generate a rounding residual value, as well as a parity residual value (described in later sections), associated with the rounding operation.

FIG. 4 presents a table 400 showing examples of quantization errors resulting from spectral line quantization performed using a standard rounding rule. Four examples of spectral line quantization are shown. The four spectral lines have values of 105, 201, 174, and 139, respectively. Each spectral line value is divided by a global gain value of 10. The division generates four floating-point values of 10.5, 20.1, 17.4, and 13.9. The four floating-point values are quantized via rounding, using a standard rounding rule, to generate four integers having the values of 11, 20, 17, and 14, respectively. Each quantization is associated with a quantization error, which are 0.5, 0.1, 0.4, and 0.1, respectively. Also shown in table 400 are four rounding residual values, which are −1, +1, +1, and −1, respectively. Each rounding residual value, shown as either a −1 or +1 value, indicates a direction that the actual floating-point value is positioned, along a real number line, relative to the integer value obtained as result of the rounding operation. In other words, the rounding residual value indicates whether the quantized value (i.e., integer value) is above or below the actual value (i.e., floating-point value). Each rounding residual value may be optionally sent, along with each integer value (or a codeword representative of the integer value), through the transmission or storage channel. Doing so provides additional information on the quantized values, which add extra resolution to each spectral line when it is reconstructed at the codec decoder on the other side of the channel.

Returning back to FIG. 3, after performing quantization to generate quantized values representing the spectral lines, the quantizer unit 204 may perform source coding to encode the quantized values. The source encoding operation may convert the quantized values into codewords according to an appropriate source coding scheme. In one embodiment of the disclosure, an arithmetic code is used as the source encoding scheme. Arithmetic coding refers to a class of coding schemes that encodes an entire message into a code string which represents a fractional value q, where $0.0 < q < 1.0$. The coding algorithm is symbol-wise recursive, i.e., it operates upon and encodes (decodes) one data symbol per iteration or recursion. On each recursion, the algorithm successively partitions an interval of the number line between 0.0 and 1.0, and retains one of the partitions as the new interval. The size of a symbol's subinterval is proportional to the estimated probability that the symbol will be the next symbol in the message. As shown in FIG. 3, the arithmetic encoder 306 obtains the quantized values, each representing a quantized spectral line, from the rounding unit 304. The arithmetic encoder 306 outputs encoded codewords based on the quantized values. Because each quantized value may have a different probability of occurrence, the total length of the concatenation of the encoded codewords (i.e., the code string) is variable. Padding bits may be appended to the variable length arithmetic code string, in order to form a fixed length data frame (if a fixed-length data frame is desired).

FIG. 3 further illustrates the construction of a data frame by the quantizer unit 204. In the example shown, a data frame may comprise, for each spectral line, the arithmetically encoded codeword corresponding to the quantized value representing the spectral line. The data frame may optionally comprise, for each spectral line, the rounding residual value associated with the quantization performed on the spectral line. The rounding residual value may take on a value of +1 or −1, which may be represented using a "1" bit or "0" bit, respectively. If extra space is available in the data frame (i.e., if padding bits are present), the rounding residual value may be added in the place of one or more padding bits, in order to provide extra resolution to the reconstruction of the spectral line on the receive side of the channel. In addition, the data frame may optionally comprise, for a group of spectral lines, a parity residual value. Sections below describe in more detail the generation of such a parity residual value. The data frame may further comprise additional padding bits, one or more sign bits indicating a positive or negative sign for each spectral line, and a header, which may include information such as various control parameters used in the data compression operation.

In the embodiment shown in FIG. 3, the quantizer unit 204 performs both a quantization function and a data frame-construction function. In other embodiments, a separate frame assembly unit, apart from the quantizer unit, may be used to construct the data frame.

Error Resilience Using Parity

Error resilience is provided by adding a low-cost parity check to each group of quantized spectral lines, according to various embodiments of the disclosure. The low-cost parity check may be achieved by utilizing a specialized rounding operation on one spectral line in a group of spectral lines. The specialized rounding operation may be used to force a group parity value computed for the group of quantized spectral lines to a predetermined parity value.

Referring again to FIG. 4, the quantization of four spectral lines are shown. In a simple example, a group of spectral lines may consist of these four spectral lines, which correspond to floating-point values of 10.5, 20.1, 17.4, and 13.9. A specialized rounding operation may be used to quantize one particular spectral line selected from the group of spectral lines. A standard rounding operation may be used to quantize the remaining spectral lines in the group. Such use of a specialized rounding operation on a select spectral line may force a parity value computed for the entire group of quantized spectral lines to a predetermined value. The specialized rounding operation does this by flipping the rounding direction used for rounding the floating-point number. That is, by choosing to "round up" instead of "round down" (or "round down" instead of "round up"), the specialized rounding operation changes the resulting quantized value to be an even integer instead of an odd integer (or odd integer instead of an even integer), thus flipping the resulting parity value computed for the entire group of quantized spectral lines. In this manner, the specialized rounding operation may be used to force the group parity value to the predetermined value, (e.g., "0" or "1").

For example, the spectral line having a floating-point value of 10.5 may be rounded (according to a standard rounding operation) to the integer value 11, resulting in a quantization error of 0.5. If the floating-point value of 10.5 were instead rounded to 10 (according to a specialized rounding operation), in order to force the group parity value to a particular predetermined value, the quantization error would still be 0.5. Thus, the floating-point value of 10.5 is an excellent candidate for applying the specialized rounding operation. There is zero additional cost associated with using the specialized rounding operation instead of the standard rounding operation in this case. Either way, the rounding error is 0.5.

Taking a different example, the spectral line having a floating-point value of 17.4 may be rounded (according to a standard rounding operation) to the integer value 17, resulting in a quantization error of 0.4. If the floating-point value 17.4 were instead rounded to 18 (according to a specialized rounding operation), in order to force the group parity value a particular predetermined value, the quantization error would be 0.6. Thus, the floating-point value of 17.4 is a less desirable candidate (compared to 10.5) for applying the specialized rounding operation. In this case, an extra cost associated with using the specialized rounding operation instead of the standard rounding operation corresponds to the additional amount of quantization error incurred, i.e., 0.2, which is the difference between 0.4 and 0.6.

According to an embodiment, the spectral line whose floating-point value is closest to a midpoint between two nearest possible quantized values (two nearest integers, in this case), as compared to other spectral lines in the group, is selected as the spectral line on which the specialized rounding operation is performed. Put another way, the spectral line whose quantization leads to the largest quantization error is selected to receive the specialized rounding operation. In the illustrative group of spectral lines shown in FIG. 4, the spectral line having the floating-point value 10.5, which has the largest quantization error, is selected to receive the specialized rounding operation.

For the group of four spectral lines shown in FIG. 4, the group parity value may be computed as the parity value of the sum of the four integer values 11, 20, 17, 14. This sum corresponds to a group parity value of "0" (i.e., even parity). If it is decided that the group parity value is to be forced to "0," no additional step is necessary. However, if it is decided that the group parity value is to be forced to "1" (i.e., odd parity), then the specialized rounding operation may be performed on the selected spectral line associated with the largest quantization error (in this case, the spectral line having the floating-point value 10.5). Here, the specialized rounding operation quantizes the floating-point value 10.5 to an integer value of 10 instead of 11. This flips the group parity value computed for the entire group of four quantized spectral lines from "0" to "1." The desired group parity value is thus achieved.

According to an additional embodiment, the selection of a particular spectral line on which the specialized rounding operation is performed may be further refined by introducing a selection bias that favors higher frequency spectral lines. The bias may lead to improved performance, because rounding error introduced in higher frequency spectral lines may result in better audio quality, as compared the same magnitude rounding error introduced in lower frequency spectral lines. In a specific embodiment, such frequency bias can serve as a "tie breaker" in the previously described spectral line selection process based on rounding error magnitude.

Suppose in a group of spectral lines, there is a tie between a first spectral line and a second spectral line in terms of the magnitude of their respective rounding errors. For example, the first spectral line may have a floating-point value of 10.6, and the second spectral line may have a floating-point value 8.6. In both cases, the distance to the midpoint (i.e., 10.5 and 8.5, respectively) between two nearest possible quantized values (two nearest integers, in this case) is 0.1. Both spectral lines are equally close to the ideal midpoint between two nearest integers. The first spectral line and the second spectral line would have the same magnitude of quantization error and would be tied in terms of which is a better candidate for being selected as the spectral line on which the specialized rounding operation is performed. In such a situation, frequency bias may be used to break the tie. As mentioned previously, when a transform such as a MDCT is performed, the resulting spectral lines correspond to frequency bins. Each spectral line comprises a numerical value reflecting the magnitude of the digitized audio data within a corresponding frequency bin of the transform. Continuing with the same example, the first spectral line is associated with a bin corresponding to a first frequency, and the second spectral line is associated with a bin corresponding to a second frequency. If the first frequency is higher than the second frequency along the frequency spectrum, then the first spectral line may be chosen over the second spectral line as the selected spectral line on which the specialized rounding operation is performed. Such a technique can further improve the system for enforcing a group parity value and lead to better audio performance.

In other examples, the selection bias favoring higher frequency spectral lines might be introduced in a more complex way. In some instances, a spectral line associated with a larger rounding error but a higher frequency bin may be selected, in order to improve overall audio performance. Thus, a tradeoff can be made between the audio performance gain associated with selecting a spectral line for its higher frequency versus the performance loss associated selecting the spectral line for its lower rounding error magnitude. In one implementation, such performance gains and losses are quantified into concrete values, and an evaluation is performed based on such values to settle audio performance tradeoffs. For example, a first spectral line may be associated with a first frequency bin and a first floating-point value that is at a first distance between a midpoint between two nearest integers. A second spectral line may be associated with a second frequency bin and a second floating-point value that is at a second distance between a midpoint between two nearest possible quantized values. In the frequency spectrum, the first frequency bin may be $\Delta_f$ KHz higher than the second frequency bin. However, the second floating-point number may be $\Delta_M$ closer to the ideal midpoint value between nearest possible quantized values than the first floating-point number, as compared to the first floating-point value. By using a look-up table, for instance, the selection process may determine that, at the relevant frequency ranges, a difference in frequency of $\Delta_f$ KHz translates to a difference in rounding-related audio performance of P1. At the same time, another table look-up may reveal that, at the relevant frequency ranges, a difference in rounding error of $\Delta_M$ translates to a difference in audio performance of P2. If P1>P2, the selection process may choose the first spectral line, over the second spectral line, as the spectral line in the group on which the specialized rounding operation is applied. Otherwise, the selection process may choose the second spectral line, over the first spectral line, as the spectral line in the group on which the specialized rounding operation is applied.

According to yet an additional embodiment of the disclosure, the size of each group, i.e., the number of spectral lines contained in each group, may be predetermined and chosen based on a balance of competing considerations. On one hand, the smaller the group size, the more bit error resilience protection that is provided. This is because a smaller group size generates fewer codewords, which means that there are fewer bit positions in which to detect or correct bit errors using knowledge of the group parity value. The bit error detection or correction afforded by the group parity value is thus expected to be stronger for a group having a smaller group size, as compared to a group having a larger group size. On the other hand, the smaller the group size, the lower the chance of finding a large quantization error in the group. Thus, a smaller group size means the extra cost associated with using the specialized rounding operation on the selected spectral line may be greater. Put another way, the smaller the group size, the lower the chance of finding an ideal candidate, such as the spectral line having the floating-point value 10.5 illustrated in FIG. 4, (or a close-to-ideal candidate) for applying the specialized rounding operation with little or no penalty.

Data frames generated using the bit error resilience techniques disclosed herein may maintain compatibility with one or more existing standards for audio data compression. Such existing standards may be based on quantization of spectral lines using only a standard rounding operation. A data frame generated using the specialized rounding operation, e.g., in order to force a particular group parity value, may only differ in terms of one selected spectral line having a quantized value that results from a choice to "round up" instead "round down" (or "round down" instead of "round up"). Typically, this amounts to a small difference in quantization error for one select spectral line in a group of spectral lines. A codec decoder built according to an existing audio data compression standard using a standard rounding operation can receive and decompress data frames originating from a transmitter incorporating the techniques for forced group parity value disclosed herein. Similarly, a codec decoder incorporating the techniques disclosed herein may receive and decompress data frame originating from a transmitter built according to an existing audio data compression standard using a standard rounding operation. Thus, the presently disclosed techniques for bit error resilience may facilitate interoperability with devices built based on existing audio data compression standards.

A benefit of the bit error resilience techniques disclosed herein relates to cumulative parity. A feature of an arithmetically encoded stream is that the data may need to be read in order. The encoding scheme used in the codec encoder can result in a change in the length of the encoded symbols/codewords when an error occurs. When this occurs, the parity checks after the error are likely to fail. The parity check scheme disclosed here may ensure the integrity of all data before and including the current group of spectral lines. Therefore, the parity check scheme can protect more than one bit error in each group of spectral lines, except for the last group.

More generally speaking, the parity check scheme can be applied to a group of data that includes other types of information besides spectral lines. As long as groups of data are sent, and there are values to be quantized within each group, the use of a specialized rounding rule to enforce a parity value for each group can be employed. Indeed, the specialized operation may be performed on data that is not a spectral line but is part of the group of data being sent.

In the aforementioned embodiments, scalar quantization of the spectral lines is described for easy of illustration. In other embodiments, more advanced quantization techniques may be utilized. For example, a non-linear quantization look-up table, vector quantization (e.g., Pyramid Vector Quantization), quantization by synthesis, dictionary look-ups, etc. may be used instead of simple scalar quantization. More advance quantization techniques may add complexity but may also improve compression, e.g., in terms of providing better audio performance. Just as an example, in the case of vector quantization, a sequence of k spectral lines may be viewed as an k-dimensional vector, $[x_1, x2, \ldots, x_k]$ and quantized by choosing the nearest matching vector from a set of k-dimensional vectors $[y_1, y_2, \ldots, y_n]$ with $y_n<k$. The disclosed parity check scheme can be applied to the quantized values obtained using such advanced quantization techniques.

Furthermore, in the aforementioned embodiments, spectral line quantization and source coding (i.e., entropy coding) are described as two separate steps for easy of illustration. In other embodiments, spectral line quantization and source/entropy coding may be merged into a combined step. For instance, a set of valid codewords constituting an alphabet may be created. Spectral line values may map directly onto the codewords, such that quantized values are reflected in the alphabet (e.g., through use of convolutional codes). The various considerations for quantization, such as quantization error and frequency bias, etc., may be taken into account in constructing the codewords and mapping.

In addition, in the aforementioned embodiments, parity has been described in terms of a choice between an even versus an odd bit value. In other embodiments, parity can be more broadly defined as a choice to select among multiple possible source/entropy encoded symbols (e.g., codewords). The choice to select one particular source/entropy encoded symbol reflects the "parity" being enforced. A cost function may be used to select the source/entropy encoded symbol that minimizes the quantization error, achieve frequency bias, etc., yet maintain the desired parity value. Such techniques may be well-suited to implementations involving Huffman coding, asymmetric numeral systems (ANS) coding, and the like, as the source/entropy coding scheme.

Parity Residual

Figure 5:
FIG. 5 presents a table illustrating the generation of a parity residual value, according to an embodiment of the disclosure.

FIG. 5 presents a table 500 illustrating the generation of a parity residual value, according to an embodiment of the disclosure. The example shown in FIG. 5 is based on a scenario in which a different spectral line is selected for applying the specialized rounding operation, in order to force a group parity value. For example, an alternative group of spectral lines having floating-point values of 20.1, 17.4, 13.9, and 12.3 may be considered. In this alternative group of spectral lines, quantizing the floating-point values results in quantized values of 20, 17, 14, and 12, respectively. The quantization errors are 0.1, 0.4, 0.1, and 0.3, respectively. The spectral line having the greatest quantization error is the spectral line corresponding to the floating-point value 17.4, and it is selected as the spectral line on which the specialized rounding operation is performed. The sum of the quantized values 20, 17, 14, and 12 corresponds to a group parity value of "1" (i.e., odd parity). If it is decided that the group parity value is to be forced to be "0" (i.e., even parity), then the specialized rounding operation may be applied to the floating-point value 17.4.

Referring to FIG. 5, using a standard rounding operation, the floating-point value 17.4 would be rounded to a quantized value of 17. This corresponds to a quantization error of 0.4 and a rounding residual value of +1. The rounding residual value of +1 indicates that the actual floating-point value is located in a positive direction, along a real number line, relative to the quantized value of 17. Specifically, the rounding residual value of +1 indicates an estimated range of [17, 17.5) for the spectral line. The rounding residual value of +1 may be included in the data frame, to support added resolution in the reconstruction of the spectral line performed at the codec decoder on the other side of the channel.

However, in order to force the group parity value to "0," the specialized rounding operation is used instead. As a result, the floating-point value 17.4 is rounded to a quantized value of 18. This corresponds to a quantization error of 0.6, with a rounding residual error of −1. The rounding residual value of −1 indicates that the actual floating-point value is located in a negative direction, along a real number line, relative to the quantized value of 18. Specifically, the rounding residual value of −1 indicates an estimated range of [17.5, 18) for the spectral line.

Also shown in FIG. 5 is a parity residual value. A parity residual value of 0 indicates that the specialized rounding operation has not been used. In such a case, the estimated range indicated by the rounding residual remains valid. By contrast, a parity residual value of 1 indicates that the specialized rounding operation has been used. In that case, the estimate range indicated by the rounding residual may no longer be valid. Instead, the parity residual value of 1, in conjunction with the rounding residual value of −1, indicates a new estimated range of [17,17.5) for the spectral line.

The logic behind the new estimated range may be described as follows. According to the present embodiment, the rounding residual value of −1 merely indicates that the actual-floating point value is located in a negative direction, along a real number line, relative to the quantized value of 18. In other words, the floating-point value was "rounded up" to reach the quantized value of 18. However, without more information, it is unclear whether the floating-point value was "rounded up" to the quantized value of 18 as result of:

(1) quantization using the standard rounding operation—in which case the estimated range for the floating-point number would be [17.5, 18), or (2) quantization using the specialized rounding operation—in which case the estimated range for the floating-point number would be [17, 17.5).

Knowing the parity residual value revolves this ambiguity. Specifically, a parity residual value of 1 indicates that the specialized rounding operation was used. Thus, the new estimated range for the value of the spectral line is determined to be [17,17.5). The above illustrates an example of a rounding residual value indicating a first estimated range of values for the spectral line, and the parity residual value indicating a second estimated range of values for the spectral line adjacent to the first estimated range.

As discussed previously, the data frame may optionally include one or both of the rounding residual value and the parity residual value, depending on whether there is space available in the padding bits of the data frame. In the example shown in FIG. 5, the floating-point value 17.4 is rounded to the quantized value 18 using the specialized rounding operation. If neither the rounding residual value nor the parity residual value is included in the data frame, then the codec decoder may only be able to estimate the value of the spectral line based on the range of [17.5, 18.5). If only the rounding residual value but not the parity residual value is included in the data frame, then the codec decoder may estimate the value of the spectral line based on the range [17.5, 18). Finally, if both the rounding residual value and the parity residual value are included in the data frame, then the codec decoder may estimate the value of the spectral line based on the range of [17, 17.5)—i.e., with greater resolution.

Watermarking

A sequence of groups of quantized spectral lines may be parity-adjusted in this manner to achieve a sequence of predetermined parity values. For example, it may be decided that every group of quantized spectral lines is to be forced to have a group parity value of "0" (i.e., even parity). By forcing every group of quantized spectral lines to have a group parity value of "0," the transmit side of the channel provides an expected pattern of group parity values (all "0's" in this example) in the compressed data. The receive side of the channel, having knowledge of the expected pattern of group parity values, may use such knowledge to detect or correct bit errors, as discussed in more detail in sections below.

The expected pattern of group parity values may be used as a watermark. The watermark may serve various functions. In one embodiment, the watermark signifies use of the specialized rounding operation. In response to detecting such a watermark, the receive side of the channel may utilize group parity to detect or correct bit errors. Additionally or alternatively, the watermark may signify the presence of one or more parity residual values in the data frame. In response to detecting such a watermark, the receiver side of the channel may retrieve a parity residual value from the data frame and use the parity residual value to reconstruct the selected spectral line with added resolution. Additionally or alternatively, the watermark may be associated with a specific provider of an audio data compression methodology. Presence of such a watermark may indicate the manufacturing or design origin of the device generating the compressed audio data bearing the watermark.

Data Frame De-Assembly and De-Quantization

Figure 6:
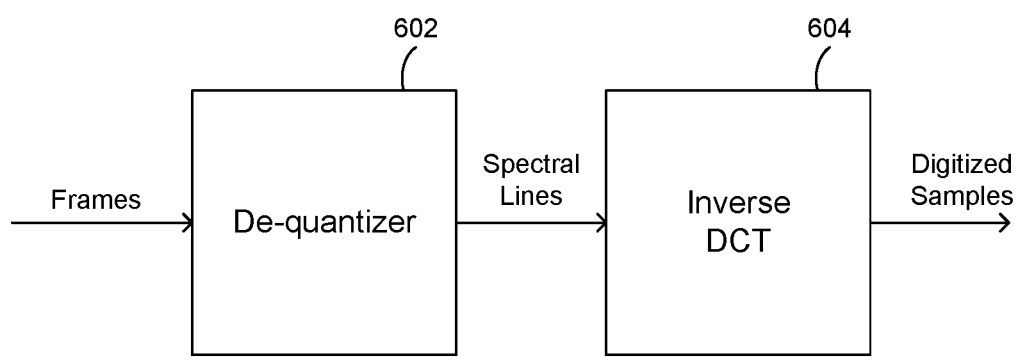
FIG. 6 presents a block diagram of a codec decoder, according to various embodiments of the present disclosure.

FIG. 6 presents a block diagram of the codec decoder 118, according to various embodiments of the present disclosure. As shown, the codec decoder 118 comprises a de-quantizer unit 602 and an inverse discrete cosine transform (Inverse DCT) unit 604. Data frames are obtained, e.g., from the optional channel decoder 116 shown in FIG. 1 and sent to the de-quantizer unit 602. Alternatively, if no channel decoder is implemented, data frames may be obtained directly from the receiver 114 shown in FIG. 1. The de-quantizer unit 602 obtains data frames comprising compressed audio data and generates sets of spectral lines. A more detailed description of de-quantizer unit 602 is presented below.

Figure 7:
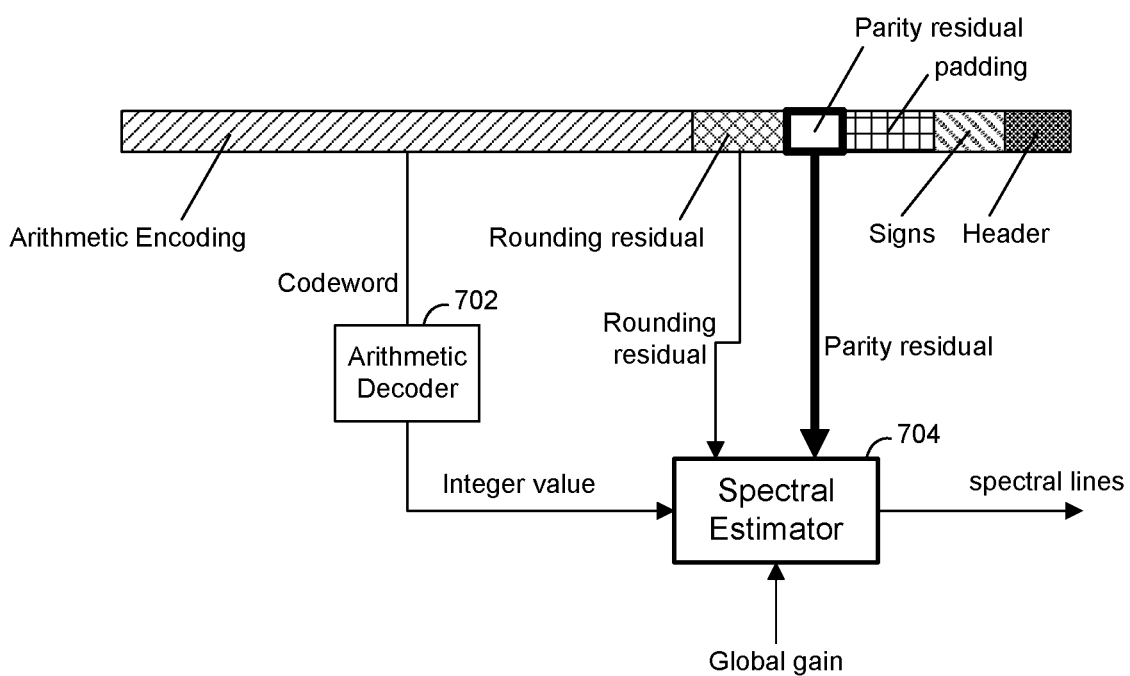
FIG. 7 illustrates an example of certain internal components of a de-quantizer unit, according to an embodiment of the present disclosure.

FIG. 7 illustrates an example of certain internal components of the de-quantizer unit 602, according to an embodiment of the present disclosure. As shown, the de-quantizer unit 602 may comprise an arithmetic decoder 702 and a spectral estimator 704. The de-quantizer unit 602 extracts various portions of data from each data frame in order to estimate the sets of spectral lines representing the compressed audio data. Arithmetically encoded codewords may be extracted from the data frame and forwarded to the arithmetic decoder 702. The arithmetic decoder 702 converts the codewords into quantized values (e.g., integers or fixed-point numbers). Each quantized value may represent a quantized spectral line.

Prior to performing de-quantization, the de-quantizer unit 602 may utilize knowledge of the group parity value for each group of quantized values, to detect or correct bit errors. Specifically, the de-quantizer unit 602 may compute a receive-side parity value for a group of quantized values obtained from the data frame. The de-quantizer unit 602 may compare the receive-side parity value for the group of quantized values to a known, predetermined parity value for the group of quantized values. The de-quantizer unit 602 may perform one or more bit error operations to detect or correct at least one bit error in the data frame, in response to detecting a difference between the computed receive-side group parity value for the group of quantized values and the predetermined group parity value for the group of quantized values.

Bit Error Detection and Correction

FIGS. 8A and 8B illustrate simplified examples of error detection and correction using a group parity value, according to one embodiment of the present disclosure. Here, a group of four quantized spectral lines are sent with a predetermined group parity value. FIG. 8A shows an example code book 800 mapping the possible quantized values of spectral lines to corresponding codewords. For simplicity of illustration, fixed-length codewords are presented. In a different implementation, variable-length codewords may be used, as mentioned previously in the case of arithmetic codes. In particular, the length of the codewords may vary based on the probability of occurrence of each codeword. Codebook 800 contains four codewords, 0x42, 0x67, 0xC3, and 0xD3, which correspond to the four possible quantized spectral line values, i.e., integers 8, 4, 11, and 14, respectively. FIG. 8B presents a table 810 showing details of how the transmit side of the channel quantizes the four spectral lines, which correspond to four different frequency bins. Each spectral line is quantized to one of the four possible quantized values, 8, 4, 11, or 14 found in the code book 800. For each spectral line, table 810 shows the global gain, value after division by global gain, quantized value, new quantized value to enforce parity, codeword, and binary version of the codeword. In addition, table 810 shows the sum of the column of the four quantized values (i.e., integers) as being 33, which has odd parity. Also, table 810 shows the sum of the column of four new quantized values to enforce group parity as being 34, which as even parity.

Here, it is assumed that the predetermined group parity value is "0" (i.e., even parity). That is, on the transmit side of the channel, the group parity value is forced to be even parity. As seen in table 810, the spectral line having a floating-point value of 10.5 is selected for the specialized rounding operation, in order to force the group parity value to even parity. Instead of rounding the floating-point value of 10.5 to a quantized value of 10, the floating-point value is rounded to a new quantized value of 11. This forces the sum of the four new quantized values to 34, which has even parity, satisfying the predetermined group parity value requirement.

A simple data packet generated at the transmitter might be:

1100001111000011010000010011001111+CRC

Here, the packet comprises the concatenation of various codewords, taken from the code book 800, that correspond to the quantized values of the group of spectral lines. In addition, a cyclic redundancy check (CRC) value is also appended to the packet and transmitted. In a traditional codec approach, the data packet might have been sent several times, such as 3, 5, or 7 times. With the benefit of having so many transmissions of the packet, the receive hardware (e.g., in receiver 114 shown in FIG. 1) may be able to repair the packet using majority voting. That is, if a majority of the transmissions (e.g., 4 out of 7 transmission) result in the same string of codewords, the repeated string of codewords may be chosen as the repaired packet. By contrast, through the use of a predetermined group parity value according to embodiments of the present disclosure, packet repair may be possible with fewer transmissions. In the examples described below, the data packet is transmitted initially and retransmitted only once, which does not allow the receive hardware to repair the packet on its own. However, the receive hardware generates and forwards a "weak bit mask" to the codec decoder. Using a weak bit mask and knowledge of the predetermined parity value for the group of quantized spectral lines, the codec decoder is able to repair the packet and recover correct values for the quantized spectral lines.

Some basic scenarios are presented below for illustrative purposes. The simple data packet generated at the transmitter is sent over the channel. The channel can have noise and introduce bit errors. Here, an initial transmission of the data packet experiences a bit error. The following packet is seen at the receiver (bit error underlined):

1100001111000011010000100110<u>1</u>111+CRC

When the receive side hardware decodes this packet, the CRC fails. This triggers a retransmission of the packet. This time, the retransmission of the packet introduces a bit error at a different bit position (bit error underlined):

110<u>1</u>0011110000110100001001100111+CRC

Once again, the CRC fails when the receive side hardware decodes the packet. In response, the receive side hardware generates a weak bit mask. The weak bit mask shows all bit positions where the two transmissions of the packet are different. The weak bit mask is sent to the codec decoder along with one of the received packets. The weak bit mask for this example is shown below:

00010000000000000000000000001000

Repair Example 1: Using Last Received Packet

In a first repair example, the last received packet (i.e., second transmission) is used to reconstruct the original packet. Again, the last received packet is:
11010011110000110100001001100111
This corresponds to decoded codewords:
0xD3 0xC3 0x42 0x67
Looking up these decoded codewords using the code book 800 yields the group of quantized spectral values:
14, 11, 8, 4 (parity=odd)→incorrect
This group of quantized spectral values has odd parity, which is not the expected group parity value. As a first step, the codec decoder may try changing the first bit in the weak bit mask. Doing so results in a new packet:
11000011110000110100001001100111
This corresponds to decoded codewords:
0xC3 0xC3 0x42 0x67
Looking up these decoded codewords using the code book 800 yields the group of quantized spectral values:
11, 11, 8, 4 (parity=even)→correct
This group of quantized spectral values has even parity, which is the expected group parity value. This confirms that the group of quantized spectral values is correct.

Example 2: Using First Received Packet

In a second repair example, the first received packet (i.e., initial transmission) is used to reconstruct the original packet. Again, the first received packet is:
11000011110000110100001001101111
This corresponds to the decoded codewords:
0xC3 0xC3 0x42 0x6F
Note that 0x6F is not a valid codeword (i.e., it does not exist in the code book 800). This indicates that an error exists. As a first step, the codec decoder may try changing the first bit in the weak bit mask. Doing so results in a new packet:
11010011110000110100001001101111
This corresponds to decoded codewords:
0xD3 0xC3 0x42 0x6F
0x6F is still not a valid codeword, indicating that an error still exists. Now the codec decoder may try changing the next bit in the weak bit mask. Doing so results in a different new packet:
11000011110000110100001001100111
This corresponds to decoded codewords:
0xC3 0xC3 0x42 0x67
Looking up these decoded codewords using the code book 800 yields the group of quantized spectral values:
11, 11, 8, 4 (parity=even)→correct
This group of quantized spectral values has even parity, which is the expected group parity value. This confirms that the group of quantized spectral values is correct.

The above examples illustrate that the codec decoder may generate a plurality of reconstructed versions of the group of codewords and select one of the reconstructed versions of the group of codewords, based on a match between (1) the computed receive-side parity value associated with the reconstructed version of the group of codewords and (2) the predetermined group parity value. The bit error detection and correction technique may exploit additional information such as a weak bit mask generated from comparison of multiple transmissions, CRC results, knowledge of the code book used to encode the quantized spectral lines, etc. Referring again FIG. 7, the de-quantizer unit 602 may use techniques such as those described above to detect or correct bit errors, in order to generate a corrected version of each group of quantized spectral lines.

In certain embodiments described above, a CRC is used to identify and/or otherwise handle errors. However, the techniques of the present disclosure are not limited to implementations adopting use of a CRC. Alternatively or additionally, other types of error correction coding schemes may be used, including Reed-Solomon codes, turbo codes, the Viterbi algorithm, etc.

De-quantization is now described in more detail. According to an embodiment of the disclosure, the spectral estimator 704 in the de-quantizer unit 602 receives the quantized values representing the spectral lines, the rounding residual value and the parity residual value (if they are available), and a global gain value (e.g., 10). Based on these values, the spectral estimator 704 estimates a de-quantized version of the sets of spectral lines. The de-quantized spectral lines may be represented as floating-point values or fixed-point values, according to various embodiments. The spectral estimator 704 may do so using operations such as interpolation, filtering, etc. to construct the sets of spectral lines Essentially, the spectral estimator 704 attempts to perform the inverse of the quantization step performed by the quantizer unit 204 on the transmit side of the channel.

Inverse DCT/MDCT Transform

Returning to FIG. 6, the inverse DCT unit 604 receives the de-quantized spectral lines generated by the de-quantizer unit 602. As discussed, a set of spectral lines representing a full range of frequency bins may comprise up to 400 (or more) spectral lines. Each spectral line may correspond to a particular frequency bin and may reflect the magnitude of the digitized audio data within the corresponding frequency bin. The inverse DCT unit 604 may perform an inverse transform operation on each set of spectral lines, to generate a time limited block of digitized samples of audio data. For example, an inverse modified discrete cosine transform (inverse MDCT) may be expressed as:

$$y_t(k) = w(k)\sqrt{\frac{2}{N}} \sum_{m=0}^{N-1} X_t(m)\cos\left(\frac{\pi}{4N}(2k+1+N)(2m+1)\right) \quad \text{(Eq. 2)}$$

$$k = 0, \ldots, 2N-1$$

The inverse MDCT operation presented in Eq. 2 corresponds a the MDCT operation presented in Eq. 1, discussed previously. The digitized samples of decompressed audio data generated by the inverse DCT unit 604 are sent to the D/A and reconstruction unit 120 shown in FIG. 1.

As discussed previously with reference to FIG. 1, the D/A and reconstruction unit 120 receives the digitized samples of decompressed audio data and performs digital-to-analog conversion and reconstruction, such as filtering and/or interpretation, to generate an analog electrical signal. The analog electrical signal is sent to the speaker 122, which may produce and project sound waves into an environment, based on the analog electrical signal.

Figure 9A:
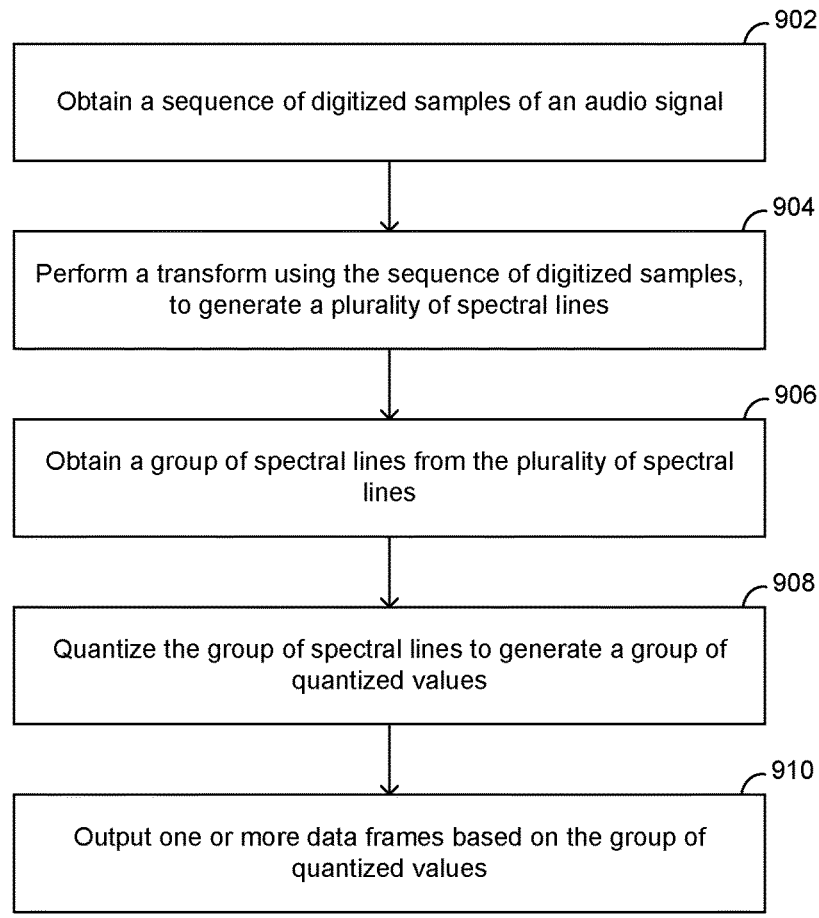
FIG. 9A presents a flowchart illustrating a process and a sub-process for compressing audio data according to an embodiment of the present disclosure.
Figure 9A:
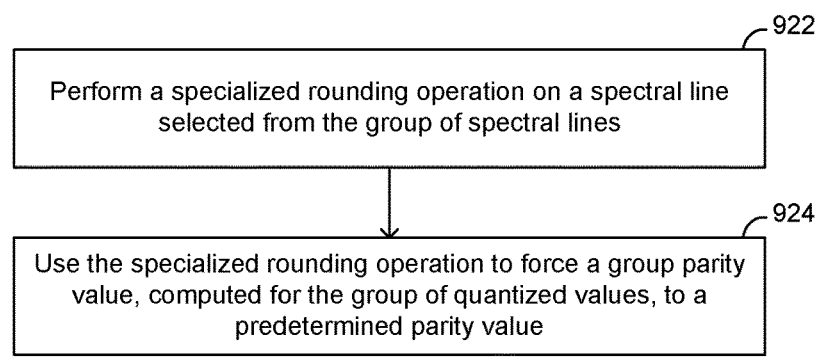

FIG. 9A presents a flowchart illustrating a process 900 and a sub-process 920 for compressing audio data according to an embodiment of the present disclosure. Process 900 includes steps 902, 904, 906, 908, and 910. Sub-process 920 includes steps 922 and 924. In step 902, a sequence of digitized samples of an audio signal are obtained. The digitized samples may be obtained, for example, from the sample and A/D unit 104 shown in FIG. 1. In step 904, a transform is performed using the sequence of digitized samples, to generate a plurality of spectral lines. The transform may be, for example, a MDCT performed by the DCT unit 202 in FIG. 2. In step 906, a group of spectral lines is obtained from the plurality of spectral lines. An illustrative group is shown in FIG. 4. In step 908, the group of spectral lines is quantized to generate a group of quantized values. Here, quantizing the group of spectral lines to generate the group of quantized values may comprise steps in subprocess 920. More specifically, in step 922, a specialized rounding operation is performed on a spectral line selected from the group of spectral lines. In step 924, the specialized rounding operation is used to force a group parity value, computed for the group of quantized values, to a predetermined parity value. The use of such a specialized rounding operation to force a group parity value to a predetermined parity value, for example, is illustrated in the descriptions relating to FIG. 3 and FIG. 4. Returning to process 900, in step 910, one or more data frames based on the group of quantized values is outputted. An example of such an outputted data frame is shown in FIG. 3.

Figure 9B:
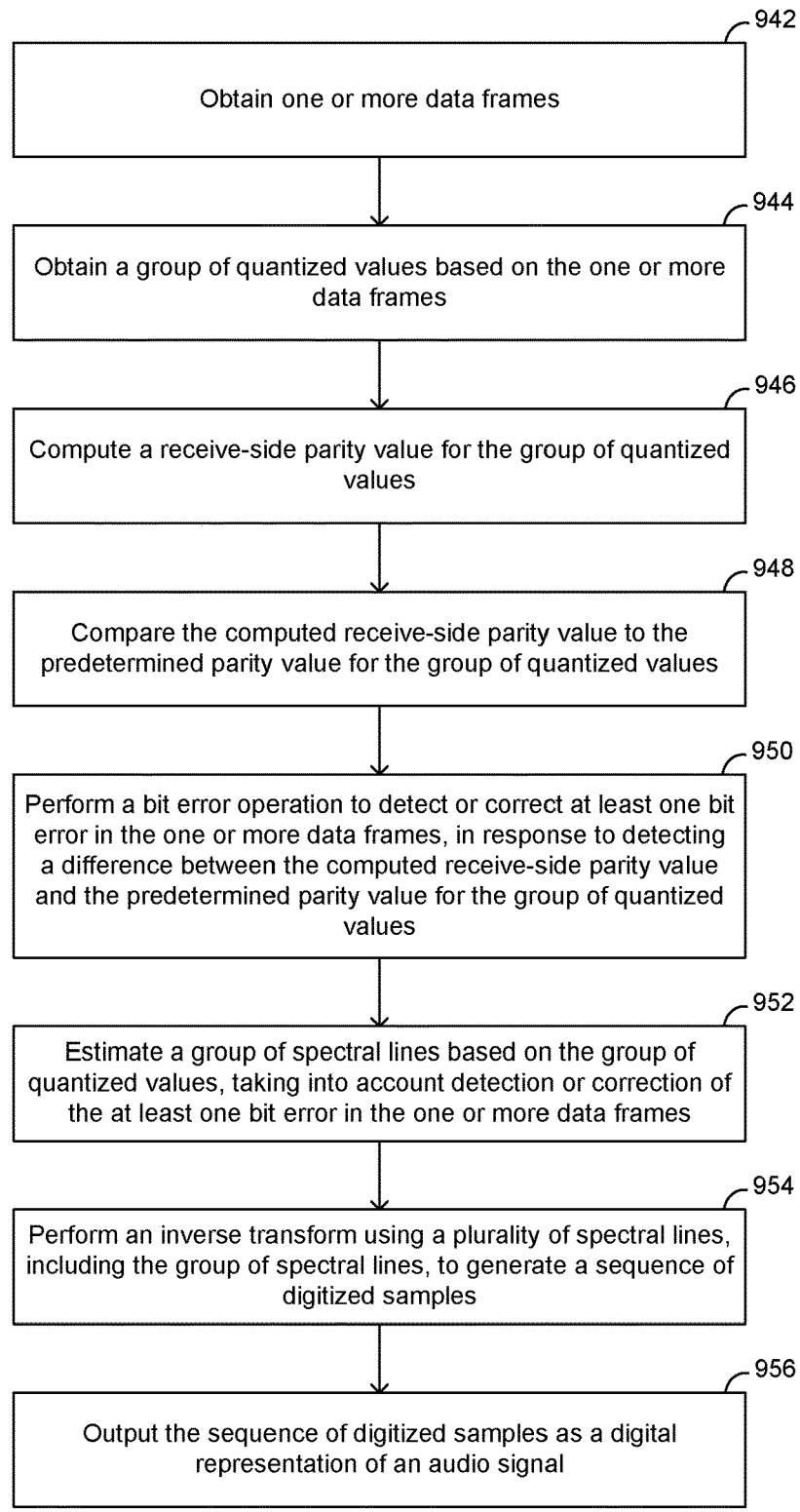
FIG. 9B presents a flowchart illustrating a process for de-compressing audio data according to an embodiment of the present disclosure.

FIG. 9B presents a flowchart illustrating a process 940 for de-compressing audio data according to an embodiment of the present disclosure. Process 940 includes steps 942, 944, 946, 948, 950, 952, 954, and 956. In step 942, one or more data frames are obtained. The data frame may be obtained, for example, from the RX unit 114 or channel decoder unit 116 in FIG. 1. In step 944, a group of quantized values based on the one or more data frames are obtained. The quantized values may be obtained, for example, as the integer values shown in FIG. 7. In step 946, a receive-side parity value for the group of quantized values is computed. In step 948, the computed receive-side parity value is compared to the predetermined parity value for the group of quantized values. In step 950, a bit error operation is performed to detect or correct at least one bit error in the one or more data frames, in response to detecting a difference between the computed receive-side parity value and the predetermined parity value for the group of quantized values. Examples of such parity value computation, comparison, and use in a bit error operation are described in the context of FIGS. 8A and 8B. In step 952, a group of spectral lines are estimated based on the group of quantized values, taking into account detection or correction of the at least one bit error in the one or more data frames. The group of spectral lines may be estimated, for example, by the spectral estimator unit 704 in FIG. 7. In step 954, an inverse transform may be performed using a plurality of spectral lines, including the group of spectral lines, to generate a sequence of digitized samples. The inverse transform may be performed, for example, by the inverse DCT unit 604 in FIG. 6. In step 956, the sequence of digitized samples may be outputted as a digital representation of an audio signal. The sequence of digitized samples may be outputted, for example, by the codec decoder 118 in FIG. 1.

Figure 10:
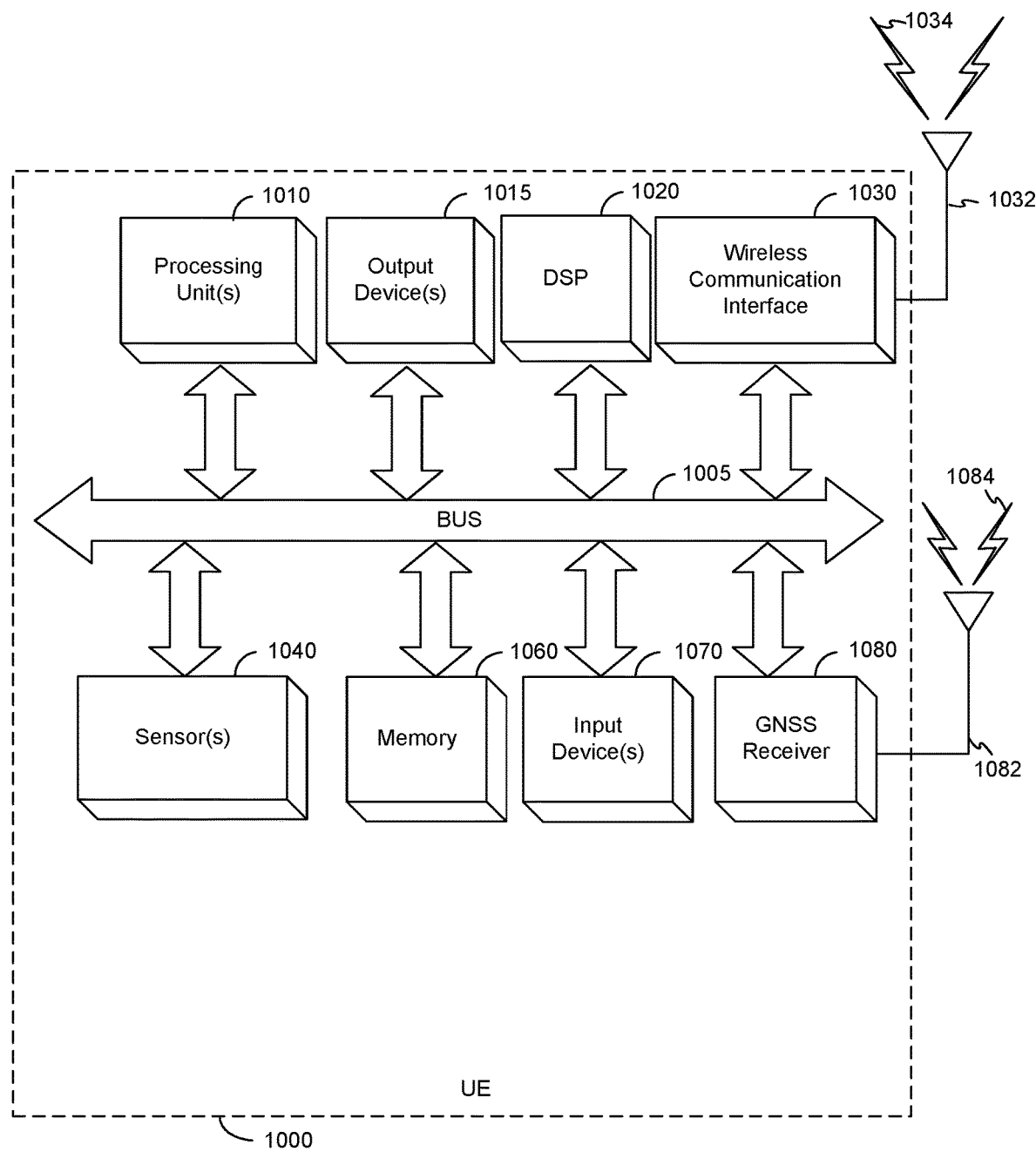
FIG. 10 is a block diagram of an embodiment of a user equipment ("UE"), which can be utilized as described in the embodiments described herein and in association with FIGS. 1-9.

FIG. 10 is a block diagram of an embodiment of a user equipment ("UE") 1000, which can be utilized as described in the embodiments described herein and in association with FIGS. 1-9. UE 1000 may implement parts of an audio path demonstrated by system 100 in FIG. 1. In a particular audio path, a first instance of UE 1000 may server as the transmit side, and a second instance of UE 1000 may serve as the receive side. In such an example, the first instance of UE 1000 may implement the transmit-side components of system 100, including microphone 102, sample and A/D unit 104, codec encoder 106, channel encoder 108, and transmit hardware 110 shown in FIG. 1. The second instance of UE 1000 may implement the receive-side components of system 100, including receiver 114, channel decoder 116, codec decoder 118, D/A and reconstruction unit 120, and speaker 122 shown in FIG. 1. The UE 1000 also supports bi-directional communications. Thus, a second audio path can be simultaneously established in the reverse direction. In the second audio path, the second instance of US 1000 may serve as the transmit side, and the first instance of the UE 1000 may serve as the receive side, utilizing components within the two instances of UE 1000 in a similar and mirrored way.

It should be noted that FIG. 10 is meant only to provide a generalized illustration of various components of the UE 1000, any or all of which may be utilized as appropriate. In other words, because UEs can vary widely in functionality, they may include only a portion of the components shown in FIG. 10. In some instances, components illustrated by FIG. 10 can be localized to a single physical device and/or distributed among various networked devices, which may be disposed at different physical locations.

The UE 1000 is shown as comprising hardware elements that can be electrically coupled via a bus 1005 (or may otherwise be in communication, as appropriate). The hardware elements may include a processing unit(s) 1010 which may comprise without limitation one or more general-purpose processors, one or more special-purpose processors (such as digital signal processing (DSP) chips, graphics acceleration processors, application specific integrated circuits (ASICs), and/or the like), and/or other processing structure or means, which can be configured to perform one or more of the methods described herein. As shown in FIG. 10, some embodiments may have a separate DSP 1020, depending on desired functionality. For example, the processing unit(s) and/or DSP 1020 may implement the codec encoder 106, channel encoder 108, channel decoder 116, and code decoder 118 shown in FIG. 1.

The UE 1000 also may comprise one or more input devices 1070, which may comprise without limitation one or more touch screens, touch pads, microphones, buttons, dials, switches, and/or the like. For example, the input device(s) 1070 may include microphone 102 and sample and A/C unit 104 shown in FIG. 1. In addition, the UE 1000 may also comprise one or more output devices 1015, which may comprise without limitation, one or more displays, light emitting diodes (LEDs), speakers, and/or the like. For example, the output device(s) 1015 may include D/A and reconstruction unit 120 and speaker 122 shown in FIG. 1

The UE 1000 might also include a wireless communication interface 1030, which may comprise without limitation a modem, a network card, an infrared communication device, a wireless communication device, and/or a chipset (such as a Bluetooth® device, an IEEE 802.11 device, an IEEE 802.15.4 device, a Wi-Fi device, a WiMAX™ device, cellular communication facilities, etc.), and/or the like, which may enable the UE 1000 to communicate via the networks described herein with regard to FIGS. 1-9. The wireless communication interface 1030 may permit data to be communicated with a network, eNBs, ng-eNBs, gNBs, and/or other network components, computer systems, and/or any other electronic devices described herein. The communication can be carried out via one or more wireless communication antenna(s) 1032 that send and/or receive wireless signals 1034. According to some embodiments, the wireless communication antenna(s) 1032 may comprise a plurality of discrete antennas, antenna arrays, or any combination thereof.

Depending on desired functionality, the wireless communication interface 1030 may comprise separate transceiver, receiver and transmitter, or any combination of transceivers, transmitters, and/or receivers to communicate with base stations (e.g., eNBs, ng-eNBs and/or gNBs) and other terrestrial transceivers, such as wireless devices and access points. For example, wireless communication interface 1030 may implement a transmitter 110 and receiver 114 shown in FIG. 1. The UE 1000 may communicate with different data networks that may comprise various network types. For example, a Wireless Wide Area Network (WWAN) may be a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, a WiMax (IEEE 802.16), and so on. A CDMA network may implement one or more radio access technologies (RATs) such as cdma2000, Wideband-CDMA (WCDMA), and so on. Cdma2000 includes IS-95, IS-2000, and/or IS-856 standards. A TDMA network may implement Global System for Mobile Communications (GSM), Digital Advanced Mobile Phone System (D-AMPS), or some other RAT. An OFDMA network may employ LTE, LTE Advanced, New Radio (NR) and so on. 5G, LTE, LTE Advanced, NR, GSM, and WCDMA are described in documents from 3GPP. Cdma2000 is described in documents from a consortium named "3rd Generation Partnership Project 2" (3GPP2). 3GPP and 3GPP2 documents are publicly available. A wireless local area network (WLAN) may also be an IEEE 802.11x network, and a wireless personal area network (WPAN) may be a Bluetooth network, an IEEE 802.15x, or some other type of network. The techniques described herein may also be used for any combination of WWAN, WLAN and/or WPAN.

The UE 1000 can further include sensor(s) 1040. Such sensors may comprise, without limitation, one or more inertial sensors (e.g., accelerometer(s), gyroscope(s), and or other Inertial Measurement Units (IMUs)), camera(s), magnetometer(s), compass, altimeter(s), microphone(s), proximity sensor(s), light sensor(s), barometer, and the like, some of which may be used to complement and/or facilitate the functionality described herein.

Embodiments of the UE 1000 may also include a GNSS receiver 1080 capable of receiving signals 1084 from one or more GNSS satellites (e.g., SVs 190) using an GNSS antenna 1082 (which may be combined in some implementations with antenna(s) 1032). Such positioning can be utilized to complement and/or incorporate the techniques described herein. The GNSS receiver 1080 can extract a position of the UE 1000, using conventional techniques, from GNSS SVs (e.g. SVs 190) of an GNSS system, such as Global Positioning System (GPS), Galileo, GLONASS, Compass, Quasi-Zenith Satellite System (QZSS) over Japan, Indian Regional Navigational Satellite System (IRNSS) over India, Beidou over China, and/or the like. Moreover, the GNSS receiver 1080 can use various augmentation systems (e.g., a Satellite Based Augmentation System (SBAS)) that may be associated with or otherwise enabled for use with one or more global and/or regional navigation satellite systems. By way of example but not limitation, an SBAS may include an augmentation system(s) that provides integrity information, differential corrections, etc., such as, e.g., Wide Area Augmentation System (WAAS), European Geostationary Navigation Overlay Service (EGNOS), Multi-functional Satellite Augmentation System (MSAS), GPS Aided Geo Augmented Navigation or GPS and Geo Augmented Navigation system (GAGAN), and/or the like. Thus, as used herein a GNSS may include any combination of one or more global and/or regional navigation satellite systems and/or augmentation systems, and GNSS signals may include GNSS, GNSS-like, and/or other signals associated with such one or more GNSS.

The UE 1000 may further include and/or be in communication with a memory 1060. The memory 1060 may comprise, without limitation, local and/or network accessible storage, a disk drive, a drive array, an optical storage device, a solid-state storage device, such as a random access memory ("RAM"), and/or a read-only memory ("ROM"), which can be programmable, flash-updateable, and/or the like. Such storage devices may be configured to implement any appropriate data stores, including without limitation, various file systems, database structures, and/or the like.

The memory 1060 of the UE 1000 also can comprise software elements (not shown), including an operating system, device drivers, executable libraries, and/or other code, such as one or more application programs, which may comprise computer programs provided by various embodiments, and/or may be designed to implement methods, and/or configure systems, provided by other embodiments, as described herein. Merely by way of example, one or more procedures described with respect to the functionality discussed above might be implemented as code and/or instructions executable by the UE 1000 (e.g., using processing unit(s) 1010). In an aspect, then, such code and/or instructions can be used to configure and/or adapt a general purpose computer (or other device) to perform one or more operations in accordance with the described methods.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including but not limited to, non-volatile media, volatile media, and transmission media. Common forms of computer-readable media include, for example, magnetic and/or optical media, punchcards, papertape, any other physical medium with patterns of holes, a RAM, a PROM, EPROM, a FLASH-EPROM, any other memory chip or cartridge, a carrier wave as described hereinafter, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this Specification discussions utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this Specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or similar special purpose electronic computing device.

Terms, "and" and "or" as used herein, may include a variety of meanings that also is expected to depend at least in part upon the context in which such terms are used. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AA, AAB, AABBCCC, etc.

Having described several embodiments, various modifications, alternative constructions, and equivalents may be used without departing from the spirit of the disclosure. For example, the above elements may merely be a component of a larger system, wherein other rules may take precedence over or otherwise modify the application of the invention. Also, a number of steps may be undertaken before, during, or after the above elements are considered. Accordingly, the above description does not limit the scope of the disclosure.

What is claimed is:

1. A method for compressing audio data comprising:
    obtaining a sequence of digitized samples of an audio signal;
    performing a transform using the sequence of digitized samples, to generate a plurality of spectral lines;
    obtaining a group of spectral lines from the plurality of spectral lines;
    quantizing the group of spectral lines to generate a group of quantized values;
    wherein quantizing the group of spectral lines to generate the group of quantized values comprises:
    performing a specialized rounding operation on a spectral line selected from the group of spectral lines, wherein the selected spectral line is selected based on a selection bias favoring higher frequency spectral lines; and
    using the specialized rounding operation to force a group parity value, computed for the group of quantized values, to a predetermined parity value; and
    outputting one or more data frames based on the group of quantized values;
    compressing the one or more data frames to generate compressed digital data; and
    encoding the compressed digital data to generate one or more channel bits.

2. The method of claim 1, wherein:
    the specialized rounding operation is performed on a pre-rounding value associated with the selected spectral line,
    the pre-rounding value comprises a floating-point value or a fixed-point value, and
    the group of quantized values comprise a group of integers or fixed-point values.

3. The method of claim 2, wherein the specialized rounding operation flips a rounding direction used for rounding the pre-rounding value associated with the selected spectral line, to force the group parity value computed for the group of quantized values to the predetermined parity value.

4. The method of claim 3, wherein the selected spectral line is selected for being associated with a pre-rounding value having a minimal distance to a midpoint between two nearest possible quantized values, as compared to other spectral lines in the group of spectral lines.

5. The method of claim 1, wherein in a tie between a first spectral line associated with a first pre-rounding value having a first distance to a midpoint between two nearest possible quantized values and a second spectral line associated with a second pre-rounding value having a second distance to a midpoint between two nearest possible quantized values, the first distance being equal to the second distance, the first spectral line is selected for being associated with a higher frequency bin of the transform than the second spectral line.

6. The method of claim 1, wherein the group of spectral lines includes a first spectral line associated with a first frequency bin and a first pre-rounding value and a second spectral line associated with a second frequency bin and a second pre-rounding value,
    wherein the first frequency bin corresponds to a higher frequency bin of the transform than the second frequency bin, wherein the first pre-rounding value corresponds to a first distance between two nearest possible quantized values, and the second pre-rounding value corresponds to a second distance between two nearest possible quantized values, the second distance being less than the first distance, and wherein the first spectral line is selected over the second spectral line.

7. The method of claim 1, wherein the one or more data frames comprise a group of codewords based on the group of quantized values.

8. The method of claim 7, wherein the group of codewords is generated from the group of quantized values using arithmetic encoding.

9. The method of claim 7, wherein the one or more data frames further comprise, for at least one quantized value in the group of quantized values, a rounding residual value.

10. The method of claim 9, wherein the one or more data frames further comprise, for the at least one quantized value in the group of quantized values, a parity residual value.

11. The method of claim 10, wherein the rounding residual value and the parity residual value are inserted in place of padding bits in the one or more data frames.

12. The method of claim 1, wherein the specialized rounding operation is used to force a sequence of groups of quantized values, quantized from a sequence of groups of spectral lines from the plurality of spectral lines, to have a sequence of predetermined parity values.

13. The method of claim 12, wherein the sequence of predetermined parity values is used as a watermark.

14. The method of claim 13, wherein the watermark signifies use of the specialized rounding operation.

15. The method of claim 14, wherein the watermark signifies presence of one or more parity residual values in the one or more data frames.

16. The method of claim 13, wherein the watermark is associated with a specific provider of a device implementing the method for compressing audio data.

17. The method of claim 1, wherein the one or more data frames maintain compatibility with an existing standard for audio data compression.

18. An encoder for compressing audio data comprising:
a transform compute device configured to receive a sequence of digitized samples of an audio signal and compute a transform using the sequence of digitized samples of the audio signal, to generate a plurality of spectral lines;
a quantizer configured to obtain a group of spectral lines from the plurality of spectral lines and quantize the group of spectral lines to generate a group of quantized values, wherein the quantizer is configured to quantize the group of spectral lines to generate the group of quantized values by performing a specialized rounding operation on a spectral line selected from the group of spectral lines, wherein the selected spectral line is selected based on a selection bias favoring higher frequency spectral lines, and wherein the quantizer is configured to use the specialized rounding operation to force a group parity value, computed for the group of quantized values, to a predetermined parity value, and wherein the quantizer is further configured to output one or more data frames based on the group of quantized values;
a compression device configured to compress the one or more data frames to generate compressed digital data; and
an encoder configured to encode the compressed digital data to generate one or more channel bits.

19. The encoder of claim 18, wherein:
the quantizer is configured to perform the specialized rounding operation on a pre-rounding value associated with the selected spectral line, the pre-rounding value comprises a floating-point value or a fixed-point value, and the group of quantized values comprise a group of integers or fixed-point values.

20. The encoder of claim 19, wherein the specialized rounding operation flips a rounding direction used for rounding the pre-rounding value associated with the selected spectral line, to force the group parity value computed for the group of quantized values to the predetermined parity value.

21. The encoder of claim 20, wherein the selected spectral line is selected for being associated with a pre-rounding value having a minimal distance to a midpoint between two nearest possible quantized values, as compared to other spectral lines in the group of spectral lines.

22. The encoder of claim 18, wherein in a tie between a first spectral line associated with a first pre-rounding value having a first distance to a midpoint between two nearest possible quantized values and a second spectral line associated with a second pre-rounding value having a second distance to a midpoint between two nearest possible quantized values, the first distance being equal to the second distance, the first spectral line is selected for being associated with a higher frequency bin of the transform than the second spectral line.

23. The encoder of claim 18, wherein the group of spectral lines includes a first spectral line associated with a first frequency bin and a first pre-rounding value and a second spectral line associated with a second frequency bin and a second pre-rounding value, wherein the first frequency bin corresponds to a higher frequency bin of the transform than the second frequency bin, wherein the first pre-rounding value corresponds to a first distance between two nearest possible quantized values, and the second pre-rounding value corresponds to a second distance between two nearest possible quantized values, the second distance being less than the first distance, and wherein the first spectral line is selected over the second spectral line.

24. The encoder of claim 18, wherein the one or more data frames comprise a group of codewords based on the group of quantized values.

25. The encoder of claim 24, wherein the quantizer is configured to generate the group of codewords from the group of quantized values using arithmetic encoding.

26. The encoder of claim 24, wherein the one or more data frames further comprise, for at least one quantized value in the group of quantized values, a rounding residual value.

27. The encoder of claim 26, wherein the one or more data frames further comprise, for the at least one quantized value in the group of quantized values, a parity residual value.

28. The encoder of claim 27, wherein the quantizer is configured to insert the rounding residual value and the parity residual value in place of padding bits in the one or more data frames.

29. The encoder of claim 19, wherein the quantizer is configured to use the specialized rounding operation to force a sequence of groups of quantized values, quantized from a sequence of groups of spectral lines from the plurality of spectral lines, to have a sequence of predetermined parity values.

30. The encoder of claim 29, wherein the sequence of predetermined parity values is used as a watermark.

31. The encoder of claim 30, wherein the watermark signifies use of the specialized rounding operation.

32. The encoder of claim 31, wherein the watermark signifies presence of one or more parity residual values in the one or more data frames.

33. The encoder of claim 30, wherein the watermark is associated with a specific provider of a device implementing a method for compressing audio data.

34. The encoder of claim 18, wherein the one or more data frames maintain compatibility with an existing standard for audio data compression.

35. A non-transitory computer-readable medium storing instructions therein for execution by one or more processing units, comprising instructions to:
obtain a sequence of digitized samples of an audio signal;
perform a transform using the sequence of digitized samples, to generate a plurality of spectral lines;
obtain a group of spectral lines from the plurality of spectral lines;
quantize the group of spectral lines to generate a group of quantized values;
wherein the instructions to quantize the group of spectral lines to generate the group of quantized values comprise instructions to:
perform a specialized rounding operation on a spectral line selected from the group of spectral lines, wherein the selected spectral line is selected based on a selection bias favoring higher frequency spectral lines; and
use the specialized rounding operation to force a group parity value, computed for the group of quantized values, to a predetermined parity value; and
output one or more data frames based on the group of quantized values;
compress the one or more data frames to generate compressed digital data; and
encode the compressed digital data to generate one or more channel bits.

36. The non-transitory computer-readable medium of claim 35, wherein:
the specialized rounding operation is performed on a pre-rounding value associated with the selected spectral line,
the pre-rounding value comprises a floating-point value or a fixed-point value, and
the group of quantized values comprise a group of integers or fixed-point values.

37. The non-transitory computer-readable medium of claim 36, wherein the specialized rounding operation flips a rounding direction used for rounding the pre-rounding value associated with the selected spectral line, to force the group parity value computed for the group of quantized values to the predetermined parity value.

38. The non-transitory computer-readable medium of claim 37, wherein the selected spectral line is selected for being associated with a pre-rounding value having a minimal distance to a midpoint between two nearest possible quantized values, as compared to other spectral lines in the group of spectral lines.

39. The non-transitory computer-readable medium of claim 36, wherein in a tie between a first spectral line associated with a first pre-rounding value having a first distance to a midpoint between two nearest possible quantized values and a second spectral line associated with a second pre-rounding value having a second distance to a midpoint between two nearest possible quantized values, the first distance being equal to the second distance, the first spectral line is selected for being associated with a higher frequency bin of the transform than the second spectral line.

40. The non-transitory computer-readable medium of claim 36, wherein the group of spectral lines includes a first spectral line associated with a first frequency bin and a first pre-rounding value and a second spectral line associated with a second frequency bin and a second pre-rounding value, wherein the first frequency bin corresponds to a higher frequency bin of the transform than the second frequency bin, wherein the first pre-rounding value corresponds to a first distance between two nearest possible quantized values, and the second pre-rounding value corresponds to a second distance between two nearest possible quantized values, the second distance being less than the first distance, and wherein the first spectral line is selected over the second spectral line.

41. The non-transitory computer-readable medium of claim 6, wherein the one or more data frames comprise a group of codewords based on the group of quantized values.

42. The non-transitory computer-readable medium of claim 41, wherein the group of codewords is generated from the group of quantized values using arithmetic encoding.

43. The non-transitory computer-readable medium of claim 41, wherein the one or more data frames further comprise, for at least one quantized value in the group of quantized values, a rounding residual value.

44. The non-transitory computer-readable medium of claim 43, wherein the one or more data frames further comprise, for the at least one quantized value in the group of quantized values, a parity residual value.

45. The non-transitory computer-readable medium of claim 44, wherein the rounding residual value and the parity residual value are inserted in place of padding bits in the one or more data frames.

46. The non-transitory computer-readable medium of claim 35, wherein the specialized rounding operation is used to force a sequence of groups of quantized values, quantized from a sequence of groups of spectral lines from the plurality of spectral lines, to have a sequence of predetermined parity values.

47. The non-transitory computer-readable medium of claim 46, wherein the sequence of predetermined parity values is used as a watermark.

48. The non-transitory computer-readable medium of claim 47, wherein the watermark signifies use of the specialized rounding operation.

49. The non-transitory computer-readable medium of claim 48, wherein the watermark signifies presence of one or more parity residual values in the one or more data frames.

50. The non-transitory computer-readable medium of claim 47, wherein the watermark is associated with a specific provider of a device implementing a method for compressing audio data.

51. The non-transitory computer-readable medium of claim 35, wherein the one or more data frames maintain compatibility with an existing standard for audio data compression.

52. A system for compressing audio data comprising:
means for obtaining a sequence of digitized samples of an audio signal;
means for performing a transform using the sequence of digitized samples, to generate a plurality of spectral lines;
means for obtaining a group of spectral lines from the plurality of spectral lines;
means for quantizing the group of spectral lines to generate a group of quantized values;
wherein the means for quantizing the group of spectral lines to generate the group of quantized values comprises:
means for performing a specialized rounding operation on a spectral line selected from the group of spectral lines, wherein the selected spectral line is selected based on a selection bias favoring higher frequency spectral lines;
means for using the specialized rounding operation to force a group parity value, computed for the group of quantized values, to a predetermined parity value; and
means for outputting one or more data frames based on the group of quantized values;
means for compressing the one or more data frames to generate compressed digital data; and
means for encoding the compressed digital data to generate one or more channel bits.

53. The system of claim 52, wherein:
the specialized rounding operation is performed on a pre-rounding value associated with the selected spectral line, the pre-rounding value comprises a floating-point value or a fixed-point value, and the group of quantized values comprise a group of integers or fixed-point values.

54. The system of claim 53, wherein the specialized rounding operation flips a rounding direction used for rounding the pre-rounding value associated with the selected spectral line, to force the group parity value computed for the group of quantized values to the predetermined parity value.

55. The system of claim 54, wherein the selected spectral line is selected for being associated with a pre-rounding value having a minimal distance to a midpoint between two nearest possible quantized values, as compared to other spectral lines in the group of spectral lines.

56. The system of claim 52, wherein in a tie between a first spectral line associated with a first pre-rounding value having a first distance to a midpoint between two nearest possible quantized values and a second spectral line associated with a second pre-rounding value having a second distance to a midpoint between two nearest possible quantized values, the first distance being equal to the second distance, the first spectral line is selected for being associated with a higher frequency bin of the transform than the second spectral line.

* * * * *